United States Patent
Beletsky et al.

(10) Patent No.: US 7,440,884 B2
(45) Date of Patent: Oct. 21, 2008

(54) MEMORY REWIND AND RECONSTRUCTION FOR HARDWARE EMULATOR

(75) Inventors: Platon Beletsky, Sunnyvale, CA (US); Alon Kfir, San Jose, CA (US); Tsair-Chin Lin, Saratoga, CA (US)

(73) Assignee: Quickturn Design Systems, Inc., San Jose, CA (US)

( * ) Notice: Subject to any disclaimer, the term of this patent is extended or adjusted under 35 U.S.C. 154(b) by 812 days.

(21) Appl. No.: 10/373,558

(22) Filed: Feb. 24, 2003

(65) Prior Publication Data

US 2004/0148153 A1 Jul. 29, 2004

Related U.S. Application Data

(60) Provisional application No. 60/442,176, filed on Jan. 23, 2003.

(51) Int. Cl.
*G06F 9/455* (2006.01)
(52) U.S. Cl. .......................... 703/24; 703/14
(58) Field of Classification Search .............. 703/24, 703/14
See application file for complete search history.

(56) References Cited

U.S. PATENT DOCUMENTS

| | | | |
|---|---|---|---|
| 5,036,473 A | 7/1991 | Butts et al. | |
| 5,109,353 A | 4/1992 | Sample et al. | |
| 5,425,036 A | 6/1995 | Liu et al. | |
| 5,455,929 A * | 10/1995 | Bosshart et al. | ............... 703/15 |
| 5,475,830 A | 12/1995 | Chen et al. | |
| 5,551,013 A | 8/1996 | Beausoleil et al. | |
| 5,568,380 A | 10/1996 | Brodnax et al. | ............... 700/79 |
| 5,588,113 A * | 12/1996 | Johnson | ...................... 714/15 |
| 5,604,889 A * | 2/1997 | Pickens et al. | ................. 703/15 |
| 5,777,489 A | 7/1998 | Barbier et al. | |
| 5,822,564 A * | 10/1998 | Chilton et al. | ................. 703/28 |
| 5,943,490 A | 8/1999 | Sample | |
| 5,960,191 A | 9/1999 | Sample et al. | |
| 6,035,117 A | 3/2000 | Beausoleil et al. | |
| 6,051,030 A | 4/2000 | Beausoleil et al. | |
| 6,061,511 A | 5/2000 | Marantz et al. | |
| 6,088,773 A * | 7/2000 | Kano et al. | .................. 711/161 |
| 6,148,416 A * | 11/2000 | Masubuchi | ................... 714/15 |
| 6,446,249 B1 | 9/2002 | Wang et al. | |
| 6,622,263 B1 * | 9/2003 | Stiffler et al. | .................. 714/13 |
| 6,766,428 B2 * | 7/2004 | Saulsbury et al. | ........... 711/154 |
| 7,058,849 B2 * | 6/2006 | Erstad | ............................ 714/5 |

(Continued)

OTHER PUBLICATIONS

Korth, Henry, F.; Silberschatz, Abraham; "Database system concepts", Second Edition, 1991, McGraw-Hill, pp. 323-324, section 10.4.1.*

(Continued)

*Primary Examiner*—Paul L Rodriguez
*Assistant Examiner*—Russ Guill
(74) *Attorney, Agent, or Firm*—Orrick, Herrington & Sutcliffe LLP

(57) ABSTRACT

A method and apparatus for debugging circuit designs having random access memory therein. The circuit design is emulated on a hardware logic emulator. The RAM emulated by the emulator can be rewound to a previous state, and then replayed. The RAM emulated by the emulator can also be reconstructed to a state the RAM maintained at some point during a trace window.

10 Claims, 7 Drawing Sheets

U.S. PATENT DOCUMENTS

2002/0170015 A1 * 11/2002 Hornung et al. ............. 714/766
2003/0163763 A1 * 8/2003 DeLano ....................... 714/15

OTHER PUBLICATIONS

Bob Janssens et al., "The Performance of Cache-Based Error Recovery in Multiprocessors", Oct. 1994, IEEE Transactions on Parallel and Distributed Systems, vol. 5, No. 10, pp. 1033-1043.*

Nicholas S. Bowen et al., "Processor- and Memory-Based Checkpoint and Rollback Recovery", Feb. 1993, IEEE Computer, vol. 26, Issue 2, pp. 22-31.*

Michael Butler and Yale Patt, "A Comparative Performance Evaluation of Various State Maintenance Mechanisms", 1993, Proceedings of the 26th Annual International Symposium on Microarchitecture, pp. 70-79.*

K-L. Wu et al., "Error recovery in shared memory multiprocessors using private caches", Apr. 1990, IEEE Transactions on Parallel and Distributed Systems, vol. 1, issue 2, pp. 231-240.*

European Search Report; Jan. 23, 2006.

* cited by examiner

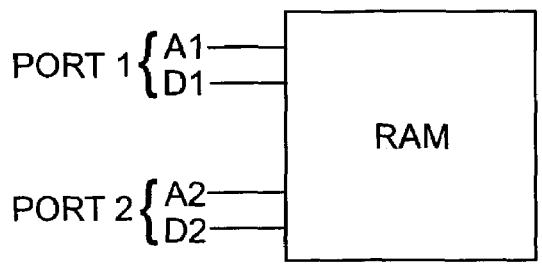
FIG. 5
| DATA | ADDRESS | M |
|------|---------|---|
| D1 | A1 | |
| D1 | A1 | |
| D2 | A2 | |
| D2 | A2 | |
| D2 | A2 | ✗ |
| ⋮ | ⋮ | |
| | | ✗ |
FIRST PREDETERMINED POINT
SECOND PREDETERMINED POINT
FIG. 6
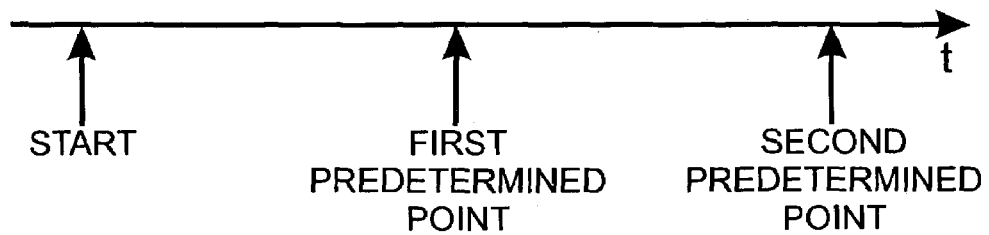
FIG. 7

| CYCLE # | D1 | A1 | D2 | A2 | |
|---|---|---|---|---|---|
| 0 | D1 | A1 | D2 | A2 | ← PORT 1 WRITTEN BEFORE PORT 2 |
| 1 | D1 | A1 | — | — | ← ONLY PORT 1 WRITTEN |
| 2 | D2 | A2 | — | — | ← ONLY PORT 2 WRITTEN |
| 3 | D2 | A2 | D1 | A1 | ← PORT 2 WRITTEN BEFORE PORT 1 |
| 4 | — | — | — | — | ← NO PORT WRITTEN IN THIS CYCLE |
| 5 | D1 | A1 | — | — | ← ONLY PORT ONE WRITTEN |

MEMORY REWIND AND RECONSTRUCTION FOR HARDWARE EMULATOR

RELATED APPLICATIONS

This application claims the benefit of U.S. Provisional Application Ser. No. 60/442,176, filed on Jan. 23, 2003. The contents of U.S. Provisional Application Ser. No. 60/442,176 are incorporated herein by reference in their entirety.

FIELD OF THE INVENTION

The field of the invention relates generally to hardware logic emulation systems used for verification of integrated circuit and electronic system designs and more particularly to a method and apparatus for restoring data stored in the memory circuits that form part of digital circuit designs from any given checkpoint back in time.

BACKGROUND OF THE INVENTION

Hardware logic emulation systems are known devices that implement a user's design in a plurality of programmable integrated circuits. Such logic emulation systems are available from various vendors, including Cadence Design Systems, Inc., San Jose, Calif., United States of America, and others. Typical emulation systems utilize either programmable logic chips or processor chips which are programmably interconnected. In programmable logic chip (e.g., field programmable gate array, or FPGA) based emulation systems, the logic contained in the user's design (referred to herein as the "design under verification", or "DUV") is programmed into the logic chip such that the logic embodied in the DUV takes actual operating form in the programmable logic devices. In processor-based emulation systems, the user's design is processed so that its functionality appears to be created in the processors by calculating the outputs of the design. The logic itself is not implemented in a processor-based emulation system, meaning that the DUV does not take actual operating form in the processors. Examples of hardware logic emulation systems using programmable logic devices can be seen in, e.g., U.S. Pat. Nos. 5,109,353, 5,036,473, 5,475,830 and 5,960,191. U.S. Pat. Nos. 5,109,353, 5,036,473, 5,475,830 and 5,960,191 are incorporated herein by reference. Examples of hardware logic emulation systems using processor chips can be seen in, e.g., U.S. Pat. Nos. 5,551,013, 6,035,117 and 6,051,030. U.S. Pat. Nos. 5,551,013, 6,035,117 and 6,051,030 are incorporated herein by reference.

The DUV is usually provided in the form of a netlist description of the design. The netlist may have been derived from many sources, including from a hardware description language. A netlist description (or "netlist", as it is referred to by those of ordinary skill in the art) is a description of the circuit's components and electrical interconnections between the components. The components include all those circuit elements necessary for implementing a logic circuit, such as combinational logic (e.g., gates) and sequential logic (e.g., flip-flops and latches). In prior art emulation systems such as those manufactured and sold by Cadence Design Systems, Inc., the netlist is compiled such that it is placed in a form that can be used by the emulation system. In an FPGA-based emulator, the DUV is compiled into a form that allows the logic gates (both sequential and combinational) to be implemented in the FPGAs. In a processor-based emulation system, the DUV is compiled into a series of statements that will be executed by the processors on the processor chips. No logic is implemented into these processors.

One of the main uses for hardware logic emulation systems is to debug the DUV so that the user's design, once fabricated in actual silicon, contains no functional errors. Circuit designers have used emulators for many years now to perform such debugging because the alternative, simulation, is much slower than emulation. Simulation is a software based approach, in which design and testbench are compiled into machine executable model and executed in workstation or PC. The testbench in an emulator is often represented as a target board, which interacts with the DUV directly.

In order to debug a DUV, the designer needs to look into activities of design signals over time. The reason for this is that digital circuits are driven by one or more clocks, and errors can occur at various transitions of the clocks driving the design, i.e., the DUV. The designer faces at least two issues when evaluating design signals over time. One issue is which signal to observe (i.e., which node in the DUV to observe). A second issue is when to observe the signals (i.e., at what clock transition and/or which confluence of events—sometimes referred to as a trigger). These two issues impose serious challenges to simulation and emulation tools. First, circuit designs are typically very large (e.g., in the order of million gates). Second, the number of signals the designer would like to observe is proportionally large. Third, since the time window in which design signals need to be observed (referred to herein as the "trace window") is hard to predict prior to simulation or emulation, the designer who is debugging a design would prefer the trace window to be as large as possible.

In order to handle these issues, circuit designers have used various approaches. One such approach is to run the DUV lockstep in a simulator. With this approach, progress of simulation is controlled by designer in interactive operation. Designers can run simulation, stop and observe signals, continue, and repeat the process. When simulation stops, designers can check the state of any signal in the design. A second approach is to perform free running simulation with signal dump. With the "free running" approach, simulation is executed freely without user intervention, and signals to be observed during simulation are dumped out during simulation. It is important to note that the signals to be dumped out must be specified before the simulation starts. These simulation approaches, while effective, are very slow. A third approach is to emulate the DUV using an emulator that allows full visibility for a fixed size of trace window. In this approach, the emulator is running freely, and signals generated by the DUV in the emulator that allow for full vision are saved for a certain period of time. A final approach is to emulate the DUV with an emulator that provides for limited visibility and replay. With this approach, limited information is saved during emulation. Designers might need to run emulation a few times in order to get sufficient information for analysis.

The design verification industry has struggled for many years to provide visibility into DUVs. Prior art emulation systems provided some functionality in this area. Most prior art emulators provided various different methods for "probing" various nodes in the DUV so that the signals at that node were observable. For example, in U.S. Pat. No. 5,425,036 to Liu et al, a method was taught that allowed signals to be probed utilizing the "readback" function present in many FPGAs. In U.S. Pat. No. 5,777,489 to Barbier et al, the FPGA had scan chains fabricated onto the FPGA that allowed for tracing all the state elements on the FPGA. Yet another method is described in U.S. Pat. No. 5,943,490, which programmed scan chains into the FPGA to allow tracing of selected subsets of state elements. In U.S. Pat. No. 6,446,249 to Wang et al, each of the logic elements (which implement the logic in the DUV) has a corresponding probe flip-flop, which can be randomly accessed by a probe sequence memory, the contents of which are read out in probe streams.

Regardless of which method the prior art systems used for capturing the values of various signals created by the DUV, no prior system can provide any debugging facilities for those portions of the DUV that include memories. In fact, prior art emulators that even considered this problem would only treat such memories as "black-boxes", meaning that the prior art emulators simply ignored the memories in the DUV and only allowed capture of the black-box's output signals. See, for example, U.S. Pat. No. 6,061,511 to Marantz et al (and specifically, Col. 6, Lines 21-30).

Because memories are an important part of any DUV, there is a need for a debugging method that allows an emulator to restore all the data stored in any location of the memories in the DUV. There is also a need for a debugging environment that does not require interruption or slow-down of the verification process for storing periodic snapshots.

SUMMARY OF THE INVENTION

The various embodiments of the present invention provide a novel method for restoring memories in a circuit design that is being emulated, thereby allowing visibility of the data stored therein. These embodiments allow memories to be restored for any given checkpoint (i.e., an point in at which a trigger occurs) back in time within a predetermined time interval. The various embodiments can do this because, unlike the prior art, all write operations for each design memory are captured. In preferred embodiments, the write operations are captured in a circular buffer. When a checkpoint in the design occurs, memory playback is performed by applying the captured (i.e., stored) write operations to the DUV in reverse order (in a clock cycle by clock cycle fashion if desired). After all write operations are played back, the contents of each design memory is restored to hold what it was storing at the moment corresponding to the bottom (or first entry) of the circular buffer that captured the write operations. The length of the time interval for restoring memories is determined by the depth of said circular buffer.

Compared with the prior art, the various embodiments of the present invention allows visibility into more than just flip-flops and combinational signals. All memories of the DUV can be viewed for the entire duration of the trace window. It also allows for replay to begin at a point where the circuit designer would like.

In one aspect, a method for verifying that a circuit design functions as desired is disclosed. The circuit design comprises a random access memory (RAM). The RAM comprises at least one write port and a plurality of memory locations for storing data. Each of the plurality of memory locations comprises an address. The method comprises emulating the circuit design in a hardware logic emulation system. Immediately prior to writing data to a selected one of the plurality of memory locations in the RAM, the method comprises reading the data stored at the selected one of the plurality of memory locations in the RAM. The method also comprises storing data read from the selected one of the plurality of memory locations in the RAM in a selected memory location within a buffer. After a checkpoint, the method comprises transferring the data stored at the selected memory location within the buffer to the selected one of the plurality of memory locations in the RAM. The method also comprises observing the data stored in the selected one of the plurality of memory locations in the RAM after the transferring step.

In another aspect, the reading the data stored at the selected one of the plurality of memory locations in the RAM step comprises, for each at least one write port in the RAM, inserting a corresponding shadow read port into the circuit design and conducting a read operation by the corresponding shadow read port so that the data stored at the selected one of the plurality of memory locations in the RAM is read by the corresponding shadow read port.

In another aspect, the storing step further comprises arranging the selected memory location within the buffer so that data stored in the buffer is output in a last in, first out manner.

In yet another aspect, the transferring step further comprises decrementing an address input to the buffer so that each of the selected memory location within the buffer are read out in a last in, first out manner. The method also comprises placing data from each of the selected memory location within the buffer on one of the at least one write ports on the RAM. The method also comprises writing the data from each of the selected memory location within the buffer placed on one of the at least one write ports on the RAM into the selected one of the plurality of memory locations in the RAM.

In another aspect, the observing step comprises observing each of the memory locations in the RAM after the writing step.

In another aspect, the storing step comprises arranging the selected memory location within the buffer so that data stored in the buffer is output in a first in, first out manner.

In yet another aspect, the transferring step further comprises incrementing an address input to the buffer so that each of the selected memory location within the buffer are read out in a first in, first out manner. The method also comprises placing data from each of the selected memory location within the buffer on one of the at least one write ports on the RAM. The method also comprises writing the data from each of the selected memory location within the buffer placed on one of the at least one write ports on the RAM into the selected one of the plurality of memory locations in the RAM, thereby restoring each memory location in the RAM to states stored therein at a predetermined time.

In another aspect, an apparatus for verifying that a circuit design functions as desired is disclosed. The circuit design comprises a random access memory (RAM). The RAM comprises a write port having a data input and an address input, a read port and a plurality of memory locations for storing data. Each of the plurality of memory locations comprises an address. The write port has a data input and an address input. The apparatus comprises a shadow read port corresponding to the write port. The shadow read port comprises an address input that receives an address from the address input of the write port, and a data output. The apparatus also comprises a buffer. The buffer is in communication with the address input of the RAM. The buffer also is in communication with the data output of the shadow read port. The buffer has an address output and a data output. The apparatus also comprises a first multiplexer feeding the address input on the write port. The first multiplexer has a first input in communication with the address output of the buffer. The first multiplexer has a second input in communication with the address input of the RAM. The apparatus comprises a second multiplexer feeding the data input on the write port. The second multiplexer has a first input in communication the data output of the buffer. The second multiplexer has a second input in communication with the data input of the RAM. The first multiplexer and the second multiplexer each have a select input that switches between a first mode and a second mode.

In another aspect, the buffer is in communication with a state machine.

In another aspect, the first mode allows signals from the address input of the RAM to be fed to the address input on the write port by the first multiplexer and signals from the data input of the RAM to be fed to the data input on the write port by the second multiplexer.

In another aspect, the second mode allows signals from the address output of the buffer to be fed to the address input on the write port by the first multiplexer and signals from the data output of the buffer to be fed to the data input on the write port by the second multiplexer.

In another aspect, the apparatus comprises a state machine in communication with the buffer.

In another aspect, the state machine controls which data and addresses stored in the buffer are read out of the address output and the data output of the buffer when the apparatus is in the second mode.

In another aspect, an apparatus for verifying that a circuit design functions as desired is disclosed. The circuit design comprises a RAM, which comprises a first write port and a second write port. The first write port comprises a first data input and a first address input. The second write port comprises a second data input and a second address input. The RAM also comprises first design data input, a first design address input, a second design data input and a second design address input, and a plurality of memory locations for storing data. Each of the plurality of memory locations comprises an address. The apparatus comprises a first shadow read port that corresponds to the first write port. The first shadow read port comprises an address input that receives an address from the first design address input. The first shadow read port further comprises a data output. The apparatus also comprises a second shadow read port that corresponds to the second write port. The second shadow read port comprises an address input that receives an address from the second design address input. The second shadow read port further comprises a data output. A first buffer in communication with the first design address input and with the data output of the first shadow read port is also present. The first buffer has an address output and a data output. The apparatus further comprises a second buffer. The second buffer is in communication with the second design address input. The second buffer is also in communication with the data output of the second shadow read port. The second buffer has an address output and a data output. A first multiplexer is included that feeds the first address input on the first write port. The first multiplexer has a first input in communication with the address output of the second buffer. The first multiplexer has a second input in communication with the first design address input. A second multiplexer fees the first data input on the first write port. The second multiplexer has a first input in communication the data output of the second buffer. The second multiplexer having a second input in communication with the first design data input. A third multiplexer feeds the first address input on the second write port. The third multiplexer has a first input in communication with the address output of the first buffer. The third multiplexer has a second input in communication with the second design address input. A fourth multiplexer feeds the first data input on the second write port. The fourth multiplexer has a first input in communication with the data output of the first buffer. The fourth multiplexer has a second input in communication with the second design data input. The first multiplexer, the second multiplexer, the third multiplexer and the fourth multiplexer each having a select input that switches between a first mode and a second mode.

In another aspect, a method for manipulating a circuit design comprising a RAM so that the circuit design can be debugged is disclosed. The RAM comprises a write port and a plurality of memory locations for storing data. Each of the plurality of memory locations comprises an address. The method comprises inserting a shadow read port into the circuit design corresponding to the write port. The shadow read port comprises an address input that receives an address from the integrated circuit design. The shadow read port further comprises a data output. The method also comprises scheduling the shadow read port to read data stored at a selected memory address immediately prior to writing data into the selected memory address by the write port. The method also comprises interconnecting the data output of the shadow read port to a buffer. The buffer stores data read in the scheduling step in a selected memory location. The buffer comprises a data output and an address output. The method also comprises inserting a first multiplexer into the circuit design such that the first multiplexer feeds an address input on the write port. The first multiplexer has a first input in communication with an address input from the circuit design. The method also comprises inserting a second multiplexer into the circuit design such that the second multiplexer feeds a data input on the write port. The second multiplexer has a first input in communication with a data input from the circuit design. The method also comprises interconnecting the address output of the buffer to a second input of the first multiplexer. The method also comprises interconnecting the data output of the buffer to a second input of the second multiplexer. After a checkpoint, the method comprises transferring the data stored at the selected memory location within the buffer to the selected one of the plurality of memory locations in the RAM. Then the method comprises observing the data stored in the selected one of the plurality of memory locations in the RAM after the transferring step.

In another aspect, the transferring step further comprises sending data stored at the selected memory locations within the buffer in a last in, first out order such that each of the selected one of the plurality of memory locations in the RAM is rewound to states held prior to the checkpoint.

In another aspect, the observing step further comprises sending data stored at the selected memory locations within the buffer in a first in, last out order such that each of the selected one of the plurality of memory locations in the RAM is restored to a state held prior to the checkpoint.

In yet another aspect, a method for verifying that a circuit design functions as desired by using a functional verification system is disclosed where the circuit design comprising a random access memory (RAM). The RAM comprises at least one write port and a plurality of memory locations. The method comprises running the circuit design in the functional verification system. Immediately prior to writing data into the RAM, reading the data. The method also comprises storing the data in a buffer. At a checkpoint, the data stored in the buffer is read in reverse order from which the data was written into the buffer. As the data is read from the buffer, the data is written into the RAM.

In another aspect, the functional verification system comprises a hardware logic verification system.

In yet another aspect, the hardware logic verification system can comprise a processor based emulation system. The hardware logic verification system can also comprise a field programmable gate array (FPGA) based emulation system.

In yet another aspect, the functional verification system comprises a software simulator. In yet another aspect, a method for verifying that a circuit design functions as desired is disclosed. The circuit design comprises a random access memory (RAM). The RAM comprising at least one write port and a plurality of memory locations. The method comprises running the circuit design in a first functional verification system. Immediately prior to writing data into the RAM, this data is read. The data is transferred to a system external from the first functional verification system. At a checkpoint, the data in the external system is reconstructed to create a reconstructed memory which corresponds to the plurality of memory locations of the RAM at a predetermined time. The reconstructing step comprises reading the previously stored data in a last in, first out order and writing the previously stored data into a memory in the external system, thereby creating the reconstructed memory.

In yet another aspect, after reconstructing the data, the reconstructed memory is transferred to the first functional verification system. The reconstructed memory is written into the RAM.

In another aspect, after reconstructing the data, the constructed memory is transferred to a second functional verification system. The first functional verification system can comprise a hardware logic verification system and the second functional verification system can comprise a software simulator.

In another aspect, a method for verifying that a circuit design functions as desired by using a functional verification system is disclosed. The circuit design comprises a random access memory (RAM) that comprises at least one write port and a plurality of memory locations. The method comprises running the circuit design in the functional verification system, saving all write operations in a buffer. Each of the write operations comprises an address and data to be stored at the address. The address and the data to be stored at the address being stored in a temporal order corresponding to the order in which the write operations took place. An image of the RAM comprised of at least the addresses where the data changed during the write operation is reconstructed by replaying each of the write operations that are stored in the buffer. The image is written into the functional verification system.

In another aspect, the functional verification system can comprise a hardware logic verification system. The hardware logic verification system can be a processor based emulation system. The hardware logic verification system can also be a field programmable gate array (FPGA) based emulation system. The functional verification system can also comprise a software simulator.

In another aspect, a method for verifying that a circuit design functions as desired by using a first functional verification system is disclosed. The circuit design comprises a random access memory (RAM) that comprises at least one write port and a plurality of memory locations. The method comprises running the circuit design in the first functional verification system and saving all write operations in a buffer. Each of the write operations comprises an address and data to be stored at the address. The address and the data to be stored at the address being stored in a temporal order corresponding to the order in which said write operations took place. An image of the RAM comprised of at least the addresses where the data changed during the write operation is reconstructed by replaying each of the write operations that are stored in the buffer. The image is written into a second functional verification system.

In yet another aspect, the first functional verification system can comprise a hardware logic verification system. The hardware logic verification system can be a processor based emulation system. The hardware logic verification system can be a field programmable gate array (FPGA) based emulation system. The first functional verification system can also comprise a software simulator.

In another aspect, the second functional verification system can comprise a software simulator. The second functional verification system can also comprise a hardware logic verification system.

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

FIG. 5 is a block diagram illustrating a multiport memory.

FIG. 6 is a diagram showing how memory stored in a circular buffer can be organized.

FIG. 7 is a timeline showing illustrating how memory rewind can take place over a time period.

FIG. 8 is a table demonstrating how the system keeps track of the temporal ordering or the write operations in an embodiment disclosed herein.

DETAILED DESCRIPTION OF THE DRAWINGS

Figure 1:
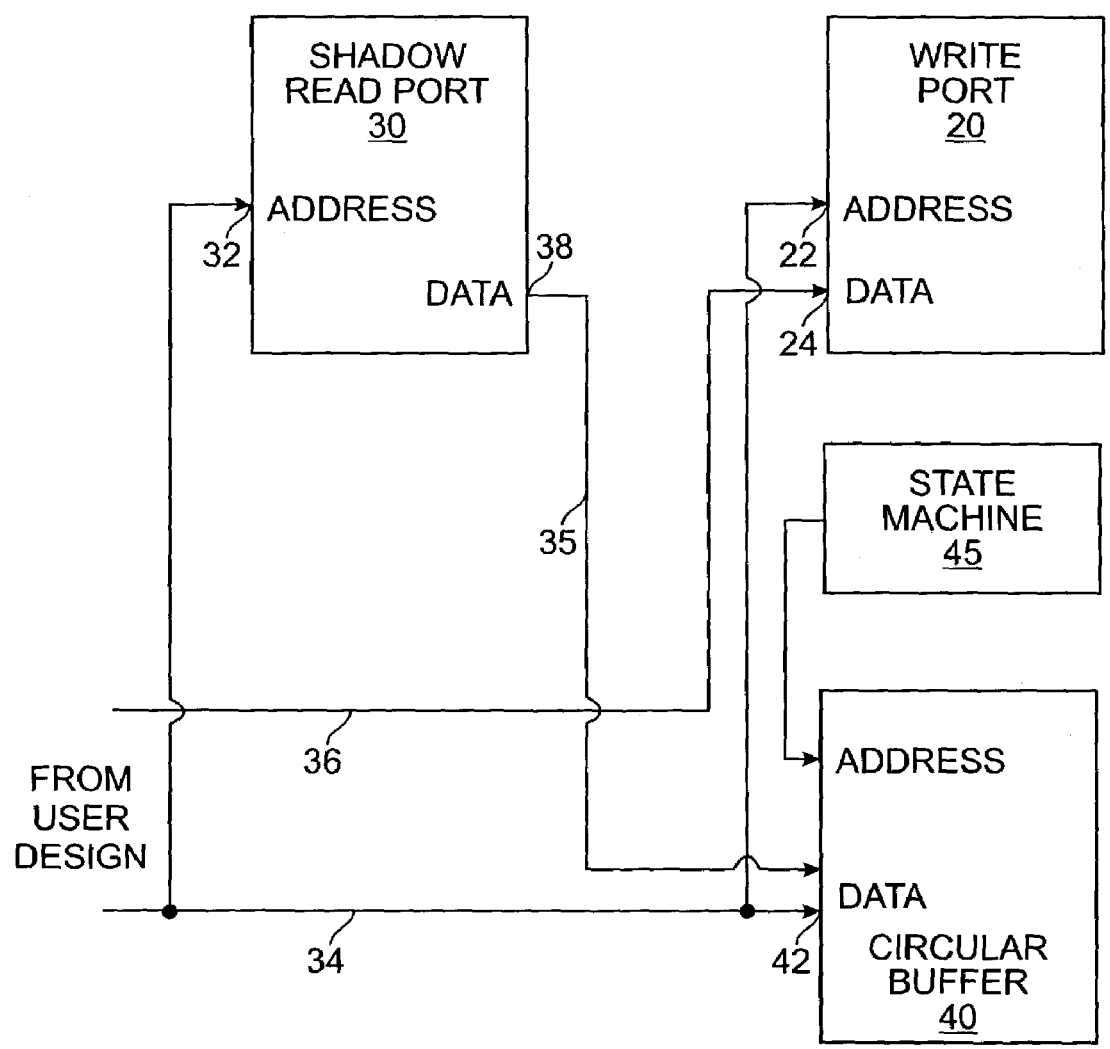
FIG. 1 is a logic diagram showing a memory in a DUV after a shadow read port has been inserted therein.

Turning to the figures, the presently preferred apparatus and methods of the present invention will now be described.

As will now be seen, one embodiment has three major components. These components are "capture", "rewind" or "reconstruction", and "replay". Capture is performed while the DUV is running in the emulator and in the context of the various embodiments of the present inventions refers to the capture of memory write operations. As will now be shown, memory write operation data is captured into a circular buffer. The depth of this circular buffer determines the length of the time interval for rewind or reconstruction, i.e., the trace window.

Initially, it must be noted that most of the discussion herein of the various embodiments will be made in the context of logic gates. In processor-based emulation systems, the methods are implemented by compiling the logic into Boolean expressions that will be executed by the processors. To the user of the emulation system, the output of the processor-based emulator is similar to that of an FPGA-based emulator. However, the manner in which the emulator's output was generated differs. In FPGA-based emulation systems, the logic referred to herein will be implemented by the logic elements (sometimes referred to as configurable logic blocks, or CLBs). The various embodiments disclosed herein can be applied to both types of emulators.

The manner in which memory write operations are captured will now be discussed with reference to FIG. 1. As discussed, almost every DUV today will contain a memory circuit 20. Typical memory circuits 20 are arranged such that they have a plurality of memory locations (not shown). Each memory location has an address that can store a certain number of bits. Memory circuits are typically classified by the number of memory locations they have (often referred to as the "depth" of the memory circuit) and the number of bits that can be stored in each location (often referred to as the "width" of the memory circuit). Therefore, a memory circuit having thirty-two thousand locations with each location containing eight bits would be called a "thirty-two thousand by eight" (i.e., 32K×8) memory circuit. When the memory circuit has multiple ports, the memory circuit is further defined by the number of write ports and the number of read ports. In a typical multi-port memory implemented in a DUV, data can be written to memory locations through multiple write ports and read from memory locations through multiple read ports.

In order to capture memory write operations, the netlist of the DUV is modified. For every write port 20 in each memory in the DUV, a shadow read port 30 is created and inserted into the DUV. Creation of shadow read ports 30 and insertion into the DUV preferably takes place during compilation, although it can take place at other times. Shadow read port 30 comprises an address input 32 and a data output 38. Write port 20 comprises a data input 24 that will receive the data to be written into the memory of the DUV and an address input 22 that will point to the particular memory location that the data will be written to. Address data is provided to the address port 22 by an address net 34. Write data is provided to data input 24 by net 36.

In addition, a circular buffer 40 is used. Circular buffer 40 will preferably be a separate memory chip such as a dynamic random access memory (DRAM), although a processor module or FPGA having on-chip memory could be designed such that circular buffers were contained thereon. In a processor-based emulator, each memory write operation in the DUV will be captured at every step in the execution cycle through shadow read ports 30. An execution cycle occurs in the presently preferred processor-based emulator as follows. During emulation, a sequencer on each module (e.g., integrated circuit) that contains the processors increments through a programmed number of steps and may repeat, until halted by the emulation support facilities. Each revolution of the sequencer corresponds to a single clock cycle of the emulated design. The sequencer effectively divides the emulated path clock cycle into multiple, e.g., 256, steps where each step corresponds to the evaluation of one logic gate of the emulated design. In FPGA-based emulators, there is no execution.

In contrast to processor based systems, FPGA based systems do not utilize a single central clock which can be used for defining an execution cycle. FPGA systems can usually accept a set of clocks that are asynchronous, meaning that each clock can generally not be derived from another clock. In some FPGA systems it is not even possible to know which signals are the clock signals. Any input signal can serve as a clock.

As also seen in FIG. 1, the DUV is modified such that address net 34 present in the DUV that normally communicates with the address port 22 of the memory in the DUV is also placed in communication with address port 32 on the shadow read port 30 and a data input 42 on circular buffer 40. Likewise, the data pin 38 on the shadow read port 30 outputs data read from the memory to data net 35, which is then input to circular buffer 40. As will be described later, circular buffer 40 is used for memory rewind. These modifications are such that address net 34 and data net 35 must be brought off chip and routed to circular buffer 40, which is preferably a separate memory chip.

Note that memory access in the DUV is preferably deterministic. Thus, while the emulator is running the DUV thereon, each shadow read port 30 read operation is scheduled to be performed before the memory's write operation via its corresponding write port 24. The reason for this is that when the DUV is writing data into an address in the memory 20, the read port of that memory 20 is set to "read" that address before the write occurs. The result of this shadow read operation is stored in circular buffer 40 (both the data stored in that address and address itself are stored). The result of the read operation is stored in the circular buffer 40. Thus, the circular buffer 40 will hold the contents of memory in the user's design (the data stored for each memory location along with its address). Note that this functions properly because the write address net 34 and output pin 38 on the shadow read port 30 write this information into the circular buffer 40 synchronously.

As seen in FIG. 1, circular buffer 40 has a address pin. When the concepts described herein are implemented in a processor based emulation system, the address pin on circular buffer 40 is in communication with a state machine 45, which controls the addressing of the data stored therein. This state machine increments the address (i.e., the locations were the data stored for each memory location along with its address from the memory 20 in the DUV) every execution cycle. When in rewind mode, described below with respect to FIGS. 1-3, the state machine decrements the address every execution cycle.

Figure 2:
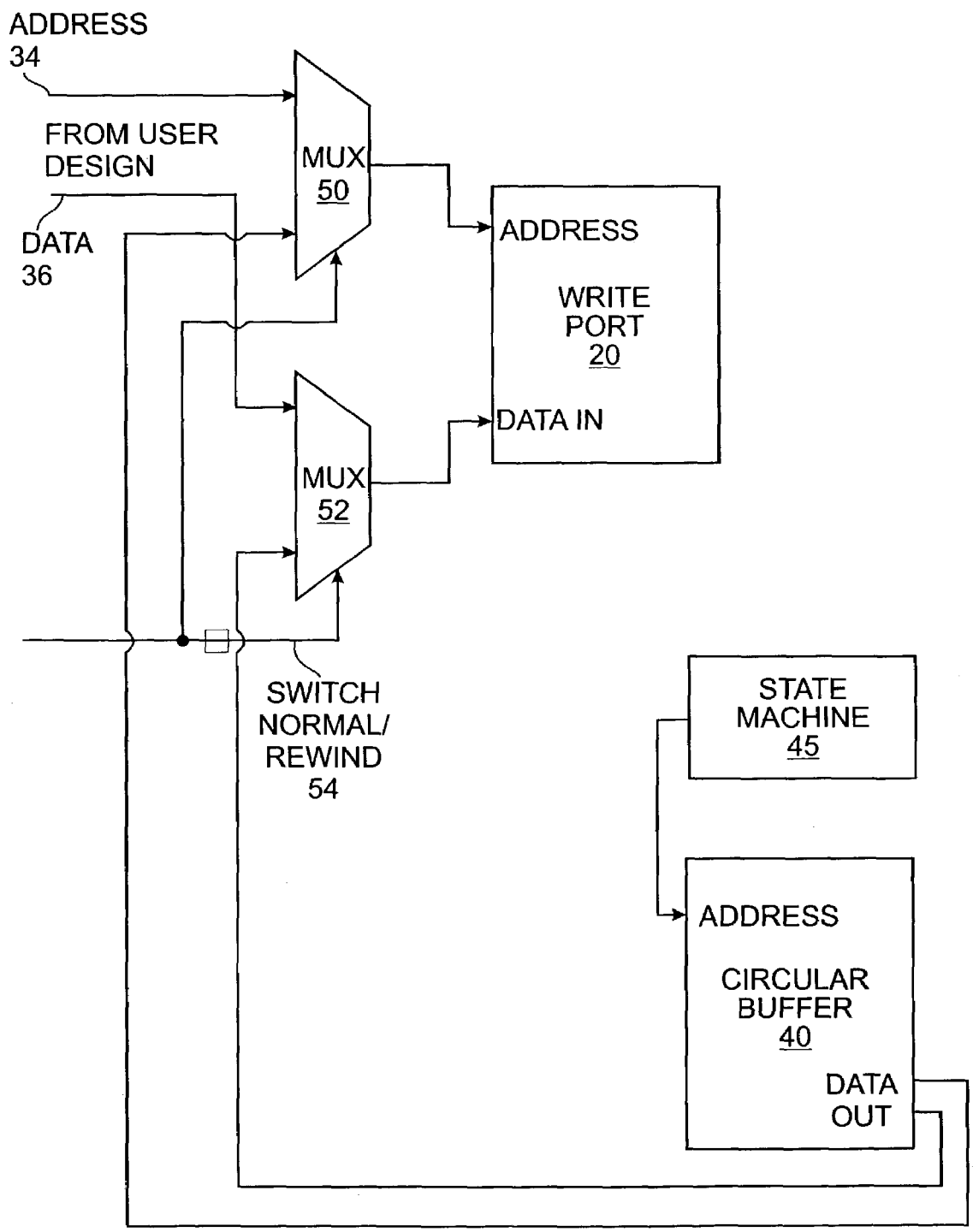
FIG. 2 is a logic diagram showing a memory in a DUV with rewind logic inserted therein.

Rewind mode will be discussed with reference to FIG. 2. Rewind is performed after initial design execution reaches user defined checkpoints. Rewind comprises playing back every memory write operations captured during the trace window. Of course, in some embodiments, only a selected number of write operations need be played back. In order for rewind to work, the presently preferred embodiments require that additional rewind logic be present in the DUV. Like the shadow read ports 30, the presently preferred embodiments insert this rewind logic into the DUV, preferably during compilation.

In addition to inserting shadow read ports 30 into the DUV, rewind logic is inserted into the DUV, preferably at compile time. Rewind logic is preferably comprised of first multiplexer 50 and second multiplexer 52. First multiplexer 50 is preferably a two-input multiplexer with a first input being a data output from circular buffer 40 and a second input being the address signal from the DUV. The select input 54 for the first multiplexer 50 is a signal that is set for either normal emulation mode or for rewind mode. Second multiplexer 52 is also preferably a two-input multiplexer with a first input being a data output from the circular buffer and a second input being a data signal from the DUV. The select input 54 is the same as the first multiplexer 50, namely a signal that selects between normal emulation mode and rewind mode. When the emulator is in emulation mode, the first multiplexer 50 and the second multiplexer 52 receive a signal on their select inputs that selects the address and design signals from the DUV, meaning that the memory 20 operates just as in FIG. 1. In contrast, when the emulator is in rewind mode, the first multiplexer 50 and second multiplexer 52 receive a signal on their select inputs that selects the address and design signals from the circular buffer 40. At approximately the same time this rewind signal is presented on the select inputs of first multiplexer 50 and second multiplexer 52, the clock that drives the circular buffer 40 begins to decrement such that data and address information stored in the circular buffer 40 is output to the corresponding data input on the first multiplexer 50 and the corresponding address input on the second multiplexer 52.

Referring to both FIG. 1 and FIG. 2, the operation of a memory in a DUV will now be discussed. During a trace window, the DUV is exercised by external signals such as signals from a target system, test vectors, simulation stimulus, etc, along with one or more clock signals. When the design being emulated attempts to write data into a memory through the first write port 20, the data (e.g., word to be stored) is input to the memory on data net 36 while the address for that word will be input to the memory on address net 34. The data signal passes through data net 36 to the second input on multiplexer 52 and the address passes through address net 34 to the second input on multiplexer 50. Note that during the trace window, the select input 54 for multiplexers 50 and 52 are set such that the first multiplexer 50 and second multiplexer 52 select the inputs from the user design.

To allow for memory rewind, a shadow read operation is scheduled prior to every write operation. Shadow read operation utilizes the shadow read port 30 and involves the same address that will be written using write port 20. Thus, the address being transmitted to write port 20 is also input to shadow read port 30. By sending this address to the shadow read port 30, the data stored in that address is output through data output 38 of shadow read port to circular buffer 40. In the memory rewind embodiments, the address and data are stored in the circular buffer 40 in a last in, first out ("LIFO") arrangement, which allows the user to decrement the state of the memory in the DUV on a step by step basis (a step being a part of an execution cycle), until the beginning of the trace window is reached. As discussed above, a state machine 45 in communication with the address pin on the circular buffer 40 controls this.

Immediately after the shadow read operation takes place for a particular memory address, the write operation for that same memory address will take place. However, because the previous value stored at that memory address is now stored in the circular buffer 40, it is available for restoration at a later time. During a write operation, the memory address from address net 34 passes through multiplexer 50 and into the address input for the write port 20. Likewise, the data to be written into that address passes from net 36, through multiplexer 52 and into write port 20, which writes that data into the selected address of the memory.

The emulator will generally go into rewind mode when a checkpoint is hit. Such checkpoints can be a trigger, a collection of events, a specific point in time that the user selects, or some other condition. To go into rewind mode, the select input 54 on first multiplexer 50 and second multiplexer 52 is set such that the memory address and the data stored at that address are passed through multiplexers 50 and 52, respectively, and through write port 20. Once select signal is switched to rewind, the emulator will operate in rewind mode. When in rewind mode, the state machine 45 communicating with the address pin on the circular buffer 40 begins to decrement. This allows the contents of the memory in the DUV to be restored, decrement by decrement, until a desired point is reached. Note that the contents of the memory can only be rewound as far back to their state at the beginning of the trace window. This is because the circular buffer will not have stored memory contents that were stored outside of the trace window. Because the value of the select input 54 is such that the select input 54 on first multiplexer 50 and second multiplexer 52 is set such that the memory address and the data stored at that address in circular buffer 40 are passed through multiplexers 50 and 52 in replay mode, write port 20 writes the data stored in circular buffer 40 at the appropriate address. Because the circular buffer 40 has a LIFO arrangement, the user can rewind the state of the memory, step by step within an execution cycle, thereby decrementing the state of the design in the reverse order in which the design ran through the trace window.

The emulator enters replay mode after full design contents (i.e., data stored in the memories, data stored in state devices and the values of the primary inputs of the DUV) are restored to the values they had at the target execution cycle. The target execution cycle is that point in time in the emulation of a design that the user needs visibility of memory states in order to debug the design. This can be many things, for example a specific point in time or a specific state of the memory. The manner in which contents of state devices and values of primary inputs are restored is beyond the scope of this disclosure.

The manner in which the multiport memories are arranged using the concepts disclosed herein will be described with reference to FIG. 3. As discussed, the various embodiments disclosed herein modify the DUV by inserting a shadow read port into the DUV for each write port. In a multiport memory containing more than one write port, more than one shadow read port will be inserted. In other words, in the preferred embodiments, there will be one shadow read port for each write port in the memory of the user's design. As also disclosed above, the various embodiments insert rewind logic into the DUV that preferably comprises multiplexers that feed the address and data inputs to the write ports.

Figure 3:
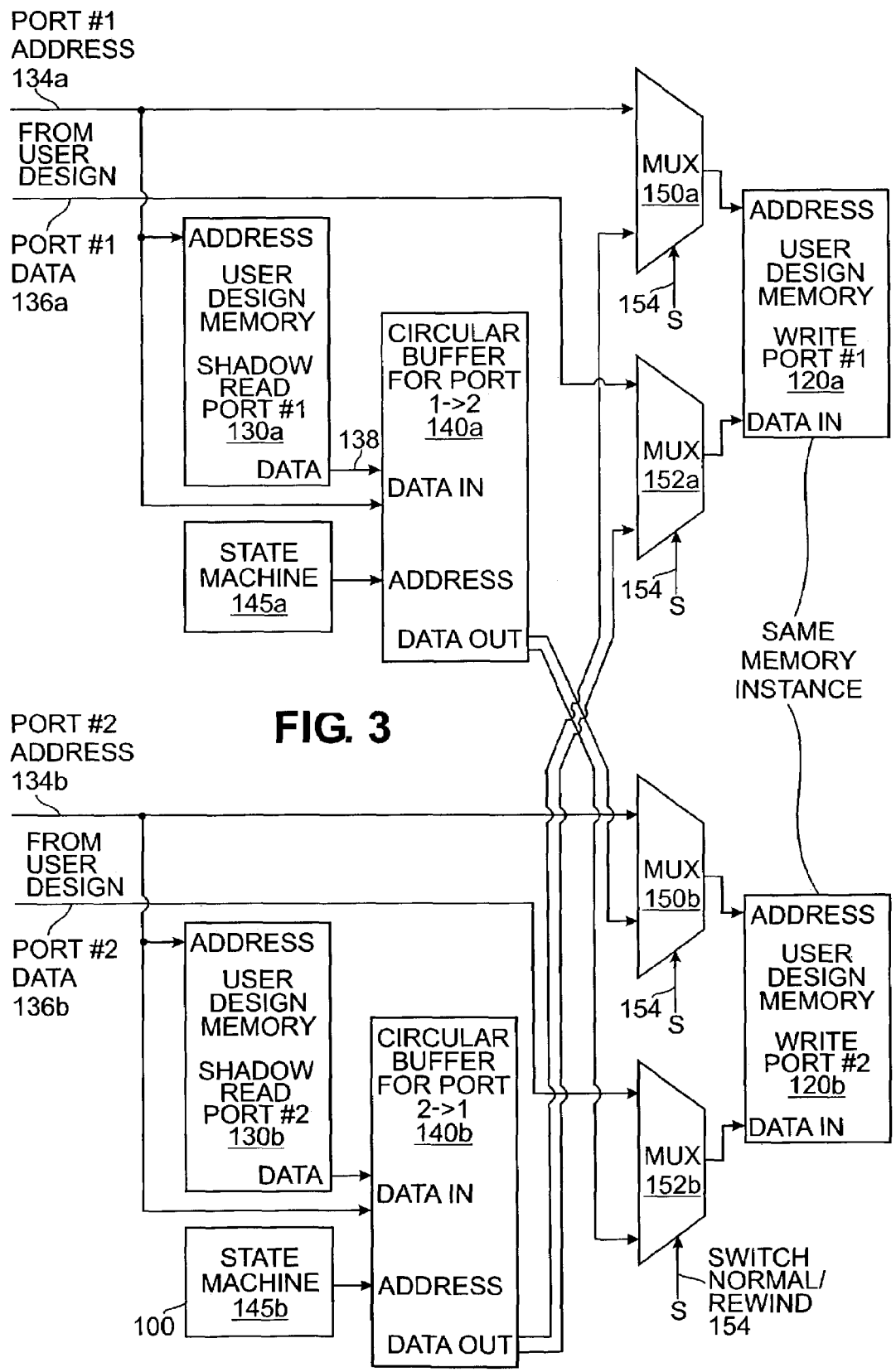
FIG. 3 is a logic diagram showing a multiport memory in a DUV with shadow read ports and rewind logic inserted therein.

The logic diagram of FIG. 3 shows an exemplary embodiment of a memory 100 from a DUV having two write ports. The example of FIG. 3 is only an example, as the various embodiments of the present invention are not limited to a memory having only two write ports. First write port 120*a* has an address input and a data input. The address input on first write port 120*a* is the output of multiplexer 150*a*. The data input on first write port 120*a* is the output of multiplexer 152*a*. As in the embodiments described above, multiplexer 150*a* preferably has two inputs, the first being a net carrying the write address for the first write port in the memory in the DUV. The second input to multiplexer 150*a* is an address stored in second circular buffer 140*b*. The reason for placing the address output from second circular buffer 140*b* on the input of multiplexer 152*a* will be discussed below. Multiplexer 152*a* preferably has two inputs. The first input to multiplexer 152*a* is a net carrying the data to be stored in the memory of the DUV. The second input to multiplexer 152*a* is data stored in second circular buffer 140*b*. The reason for placing the data that is output from second circular buffer 140*b* on the input of multiplexer 152*a* will be discussed below. Multiplexers 150*a* and 152*a* have as their select inputs a "switch" that selects between normal mode and rewind mode. Multiplexers 150*a* and 152*a* are preferably inserted at compile time. Likewise, first shadow read port 130*a* is inserted into the DUV, preferably at compile time. An input to first shadow read port 130*a* is the net 134*b* carrying the write address for the first write port 120*a* in the memory of the DUV. The output of first shadow read port 130*a* is input to a data input of first circular buffer 140*a*. First circular buffer 140*a* has an input that receives an output from first state machine 145*a*. As discussed above, first state machine 145*a* addresses the memory locations within first circular buffer 140*a* during rewind. As discussed above, the output of the first shadow read port 130*a* is the data that is stored at the memory address, along with that memory address.

The address input on second write port 120*b* is the output of multiplexer 150*b*. The data input on second write port 120*b* is the output of multiplexer 152*b*. As in the embodiments described above, multiplexer 150*b* has two inputs, the first being a net carrying the write address for the second write port in the memory in the DUV. The second input to multiplexer 150*b* is an address stored in first circular buffer 140*a*. The reason for placing the address output from first circular buffer 140*a* on the input of multiplexer 152*b* will be discussed below. Multiplexer 152*b* also has two inputs. The first input to multiplexer 152*b* is a net carrying the data to be stored in the memory of the DUV. The second input to multiplexer 152*b* is data stored in first circular buffer 140*a*. The reason for placing the data that is output from first circular buffer 140*a* on the input of multiplexer 152*b* will be discussed below. Multiplexers 150*b* and 152*b* have as their select inputs a "switch" that selects between normal mode and rewind mode. Multiplexers 150*b* and 152*b* are preferably inserted at compile time. Likewise, second shadow read port 130*b* is inserted into the DUV, preferably at compile time. An input to second shadow read port 130*b* is the net carrying the write address for the first write port in the memory of the DUV. The output of second shadow read port 130*b* is the data that is stored at the memory address, along with that memory address.

For memories with multiple write ports as in the example of FIG. 3, every write port (e.g., write ports 120*a* and 120*b*) is fed with data from a shadow read port corresponding to another write port that will be referred to as a mirror write port. In the example in FIG. 3, first circular buffer 140*a* captures data from first shadow read port 130*a* inserted into the DUV for the first write port of the memory in the DUV. Likewise, second circular buffer 140*b* captures data from second shadow read port 130*b* inserted into the DUV for the second write port of the memory in the DUV. Second circular buffer 140*b* has an input that receives an output from a second state machine 145*b*. As discussed above, second state machine 145*b* addresses the memory locations within second circular buffer 140*b* during rewind. During memory rewind, first circular buffer 140*a* feeds the same memory instance (e.g., memory address along with the data stored at that address) through second write port 120*b*. Thus, in this example, during rewind, second write port 120*b* functions as the mirror write port for first write port 120*a*. Likewise, first write port 120*a* functions as the mirror write port for second write port 120*b*).

The reason for using mirrored write ports will now be discussed. During a trace window, the DUV is exercised by external signals such as signals from a target system, test vectors, simulation stimulus, etc. When the design being emulated attempts to write data into a memory through the first write port 120*a*, the data (e.g., word to be stored) is input to the memory on data net 136*a* and the address for that word will be input to the memory on address net 134*a*. During the trace window, the select inputs 154 of multiplexers 150*a* and 152*a* are set such that the address and data for that address are passed therethrough and into the first write port 120*a*. To allow for memory rewind, a shadow read operation is scheduled prior to every write operation. Shadow read operation utilizes the first shadow read port 130*a* and involves the same address that will be written using first write port 120*a*. Thus, the address being transmitted to first write port 120*a* is also input to first shadow read port 130*a*. By sending this address to the first shadow read port 130*a*, the data stored in that address in the DUV is output through data output 138 of first shadow read port 130*a* to first circular buffer 140*a*.

Immediately after the shadow read operation takes place for a particular memory address, the write operation for that same memory address will take place. However, because the previous value stored at that memory address is now stored in the first circular buffer 140*a*, it is available for restoration at a later time. During a write operation, the memory address from address net 134*a* passes through multiplexer 150*a* and into the address input for the first write port 120*a*. Likewise, the data to be written into that address passes from net 136*a*, through multiplexer 152*a* and into first write port 120*a*, which writes that data into the selected address of the memory.

As discussed, when the emulator goes into rewind mode, the select input 154 on first multiplexer 150*a* and second multiplexer 152*a* is set such that the memory address and the data stored at that address that are stored in the first circular buffer 140*a* are passed through multiplexers 150*b* and 152*b*, respectively, and through second write port 120*b*. Second write port 120*b* then writes this data at proper address. In other words, when in rewinding, the second write port 120*b* functions as the mirror write port for the first write port 120*a*. The reason for using mirror write ports is as follows. When the emulator is running through a trace window, data is being written to locations within the memory. During each write operation, the data stored at these locations is read from the memory in the DUV by the shadow read port and stored in the circular buffers 140*a*, 140*b*, as is the address. When the memory enters rewind, the execution cycle will be played backwards, meaning that data to be stored at a particular address must be written through its mirror write port.

If the mirror write port were not used, the memory writes in a processor based emulation system would be deterministically wrong. For example, assume that at some cycle, both ports of a two write port memory write to the same address A. Further assume that port one writes data D1 followed by the port two writing data D2. Also assume that data at address A before both of these write operations was D. Shadow read port one will store data D for address A, then shadow read port two will store data D1 for this same address A. If during rewind, write ports are not mirrored, then port one will write data D followed by port two writing data D1. After these two write operations, address A will store wrong value D1 instead of correct initial value D. On the hand, if ports are mirrored, then during rewind port one writes data captured via shadow read port two, which is D1, followed by port two writing data captured via shadow port one, namely D. Hence correct initial data D is stored at address A after both writes.

Note that mirroring of write ports is set up during design compilation according to their scheduling within a single execution cycle. For a write port that is scheduled to write at the Nth step counting forward from the beginning of execution cycle, its mirror write port to be the one that is scheduled to write at the Nth step counting backward from the end of execution cycle.

Note that the multiport memory shown in FIG. 3 is merely an example. Many more ports, including an odd number of ports, can be utilized. For example, in a multiport memory have five ports, port one, port two, port three, port four and port five, port five would function as the mirror write port for port one (and vise versa), port four would function as the mirror write port for port two (and vise versa) and port three would function as the mirror write port for itself.

A manner in which the contents of a memory in a DUV can be restored will now be discussed with reference to FIG. 4. In this embodiment, the data and address values for each write port is recorded directly from beginning of emulation or simulation time (time zero) during the capture stage. Data can be captured either every main clock cycle, or only when there is a write request to the memory, in order to reduce the amount of recorded data. In the case where data is only captured when there is a write request, the data can be organized in blocks so that only the time for the beginning of each block needs to be known during the restore stage.

In this particular embodiment, shadow read ports are not used. The DUV is, however, modified by insertion of additional logic. In this embodiment, the DUV is modified by insertion of a first multiplexer 62 and a second multiplexer 64. First multiplexer 62 is preferably a two input multiplexer, the output of which feeds the address input to write port 20. Second multiplexer 64 is preferably a two input multiplexer, though output of which fees the data input of write port 20. First input to first multiplexer 62 is the address net 34 from the DUV (i.e., the user's design). First input to second multiplexer 64 is the data net 36 from the DUV. In this embodiment, the emulator has installed therein a memory circuit (e.g., a memory chip) that functions as a linear buffer 60. Linear buffer 60 receives address data from address net 34 and the data to be stored in that address from data net 36. Linear buffer 60 has a first output that transmits memory addresses to a second input on first multiplexer 62. Linear buffer also a second output that outputs the data for a particular memory address to a second input on second multiplexer 64. First multiplexer 62 and second multiplexer 64 both have a select input that selects between normal mode and reconstruction mode.

To enter the restore stage, the select input 54 to first multiplexer 62 and second input 64 are switched to reconstruction mode. This causes the first multiplexer 62 and second multiplexer 64 to output data input from the linear buffer 60. Linear buffer 60 is preferably arranged in a FIFO arrangement, meaning that the write operations are replayed from time zero of the trace window up to the point in time that the user wants to restore. Thus, unlike the circular buffer 40 described above, the state machine 65 that drives linear buffer 60 does not need to decrement. The state machine 65 is preferably synchronized with the clock that drives the DUV so that the linear buffer 60 increments its own memory locations synchronously with the write operations in the memory 20 in the DUV. Note that the memory chip (or on chip memory, if this arrangement is used), must be large enough to capture all of the data generated by the memories from time zero of the trace window. Because this method requires large amounts of memory, part of the linear buffer 60 may reside inside the emulator while another part of the linear buffer 60 may reside in the workstation that controls the emulator.

Figure 4:
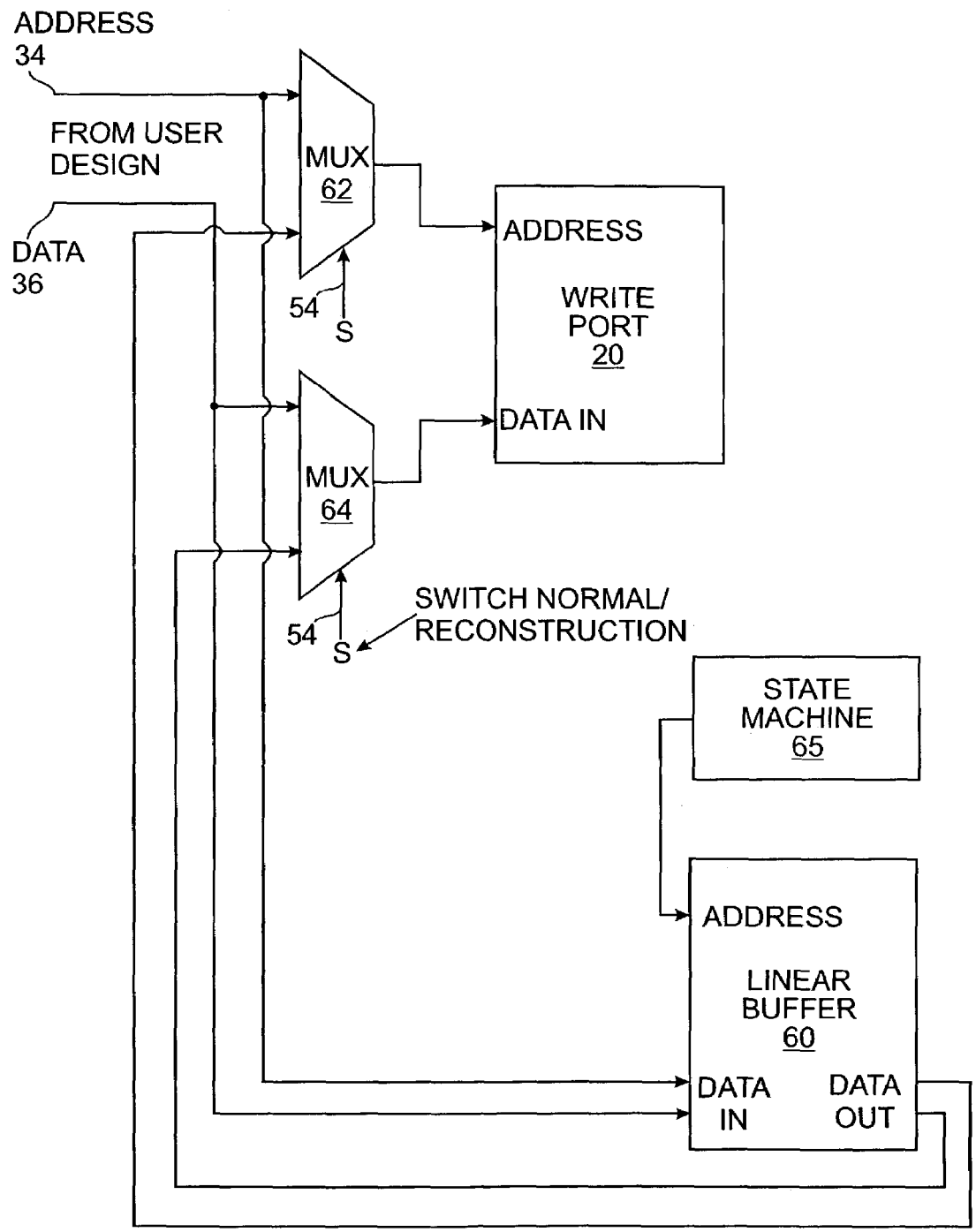
FIG. 4 is a logic diagram showing circuitry allowing memory stored in a DUV to be reconstructed.

A variation on the embodiment described with reference to FIG. 4 is to periodically store the contents of the entire memory in the DUV (akin to taking a "snapshot" of the entire contents of the memory). The period for taking this snapshot is preferably a very large period (e.g. hundreds of thousands or millions of cycles apart). In this embodiment, the restore process would first restore the memory contents from the latest saved snapshot into the memory of the DUV. The snapshot that would be restored is preferably the snapshot taken immediately prior to the point in time that user wants to restore. After restoring the memory contents with the snapshot, the DUV is replays the write operations using the method described above from the snapshot time. The advantage of this embodiment is that it does not require the linear buffer 60 to store the entire history of write operations from time zero of the trace window. Thus, a smaller linear buffer 60 can be used.

The same concepts discussed above are applicable to implementing the methods disclosed herein for FPGA-based emulation systems. There are some differences in implementation, which will now be discussed. Most of the differences in implementation are due to the fact that in FPGA based systems, there is no single central clock which can be used for defining a basic cycle like that present in processor based systems. FPGA systems can usually accept a set of clocks that are asynchronous (i.e. one cannot be derived from another), whereas processor based emulators, while being able to emulate designs with asynchronous clocks, operate synchronously internally. In fact, in some FPGA systems, the system may not even know which signals input to the emulator are clock signals. Any input signal can serve as a clock.

The order in which write operations in multi-port memories takes place in an FPGA based system is also an issue because the write order between two write ports that happen simultaneously might be determined by a miniscule time difference between the two write requests. Since write requests are not timed by a central clock, more elaborate mechanisms have to be built to handle the write ordering between different write ports.

There are at least two methods for implementing the concepts disclosed herein in FPGA based systems. A first method, which will be described with reference to FIGS. 5-7, relies on "event driven" methodologies. FIG. 5 shows a multiport memory having two write ports. Write port one is comprised of an address input A1 and a data input D1. Write port two is comprised of an address input A2 and a data input D2. In FPGA based systems, there is not a basic clock that defines a cycle (i.e., there is no execution cycle like that discussed above). Instead, snapshots of the contents of the entire state of the DUV except for the data stored in the RAMs in the DUV are stored in circular buffer (FIG. 6) at specific predetermined points during emulation. This is illustrated in FIG. 7, which shows a timeline having an emulation start, a first predetermined point and a second predetermined point. During an emulation, each write operation is stored simultaneously in the RAM of the DUV and in the circular buffer. Note that in some embodiments, data from write operations are stored in a different circular buffer than other contents of the state of the DUV. Like in the processor based implementation, shadow read ports can be used for this operation, although other implementations are possible as well. After each write to the circular buffer, the circular buffer address is advanced by one. At each predetermined point, a marker is written into the circular buffer indicating that the write operation stored at this location in the circular buffer corresponds to a predetermined point. This is shown in FIG. 6. Note that predetermined points are preferably set by the user of the verification system.

When data is written through different write ports to the same memory location, the data is stored one after the other in the circular buffer in the same order in which they are written into the memory location. In other words, data from different write ports will be written one after the other into the circular buffer according to the order in which they were written into the memory location of the RAM in the DUV. Thus, during rewind, there is no need to know which write port wrote the data into the particular memory location, as the data written into the DUV was stored in the circular buffer in the correct order. This means that the rewind phase needs only one write port to write the data into the RAM of the DUV being emulated.

Note that this implementation makes it unnecessary to utilize mirror write ports. The reason for this is that unlike processor based systems, correct ordering of data written from the circular buffer need not be achieved during rewind by reconnecting the ports in the reverse order (i.e., through mirroring of the write ports). In this embodiment, the temporal ordering of the write operations stored in the circular buffer can be relied upon to achieve the correct ordering. This is especially true given that data stored in the circular buffers will be written into the RAM through only one write port, regardless of how many write ports the RAM in the DUV actually has. Note that if a similar structure is used in a processor based system, mirroring of write ports will not be necessary in processor based systems.

It should be noted that this embodiment can also be implemented in a processor based system, which eliminates the need to use mirror write ports when using processor based verification systems.

In this method, the number of addresses that are written into the circular buffer depends on the number of write operations (which varies depending on what the DUV is doing). This requires that each memory instance has its own circular buffer, so it can advance independently of circular buffers of other memory instances.

An alternative embodiment will now be discussed. In this embodiment, a basic clock is generated internally by the system. This basic clock must be fast enough (e.g., have a high enough frequency) to sample any net without missing any transition of the fastest clock in the system. In other words, the frequency of this basic clock must be set high enough so that no signals in the DUV will change more than once during one cycle of the basic clock. Since the user of the verification system should know the DUV well enough, the user should select the frequency of the basic clock. The basic clock can be used to define "cycles", thereby making each cycle of the basic clock analogous to the execution-cycle of the processor based system. During each such cycle of the basic clock, no more than a single write operation can be done to each write port of any memory. Thus, write operations are stored the same way as in processor based systems. The rest is more or less the same as what you will do in a processor based system.

As long as each memory in the DUV has no more than one write port, the methods described above with respect to processor based systems can be used. However, when memories in the DUV have multiple write ports, a different approach is needed. The problem arises when two or more write ports are used to write data into the memory in the DUV during the same cycle of the basic clock. As discussed above, if write order through the various write ports is not maintained, the memory reconstruction will not be accurate.

Another variation is to add to the steering logic of the memory instance a special circuit that monitors the write operations and determines the actual write order from the different write ports, and then records the data in such a way that the reconstruction stage can replay them in the exact reverse order within each cycle. This embodiment relies on the temporal ordering of the write operations in the reconstruction stage to achieve the desired effect of writing the data for the different write ports in the correct order. FIG. 8 is a table showing an example of how the system can keep track of the temporal ordering of the write operations. This means that the reconstruction stage can actually write back all the data from the circular buffer into the memory instance through a single write port because the order is determined by correct sequencing them in the time domain. Again, this eliminates the need for mirror ports.

FIG. 8 shows the memory write operations for a two port memory. The first two columns show the first write operation for a given cycle while the second two columns show the second write operation for a given cycle. Turning to the example shown in FIG. 8, in the first cycle, which is the first row, port 1 is written before port 2. In the second cycle, only port 1 has a write operation. In the third cycle, port 1 undergoes a write operation. In the fourth cycle, port 2 has a write operation before port 1. In the fifth cycle, neither port 1 nor port 2 undergoes a write operation. In the final cycle, only port 1 undergoes a write operation.

In many cases, emulation systems can implement a memory with multi write ports (which we will call here a "logic memory cell") by using a "wrapper" method. The wrapper uses a simpler memory structure (which we will call the "physical memory cell") with fewer write ports (typically just a single write port) 200. A logic circuit that multiplexes the write ports to the logic memory cell 200 using time domain multiplexing is used. This means that during a single clock cycle of the design, the logic memory cells write ports are multiplexed using a higher frequency clock, so each write port may write to the physical memory cell using a different time slot. When such wrapper method is used, any of the methods for rewinding and reconstructing memory contents described herein can be applied either to the write ports of the logic memory cell, or to the write ports of the physical memory cell.

Figure 9:
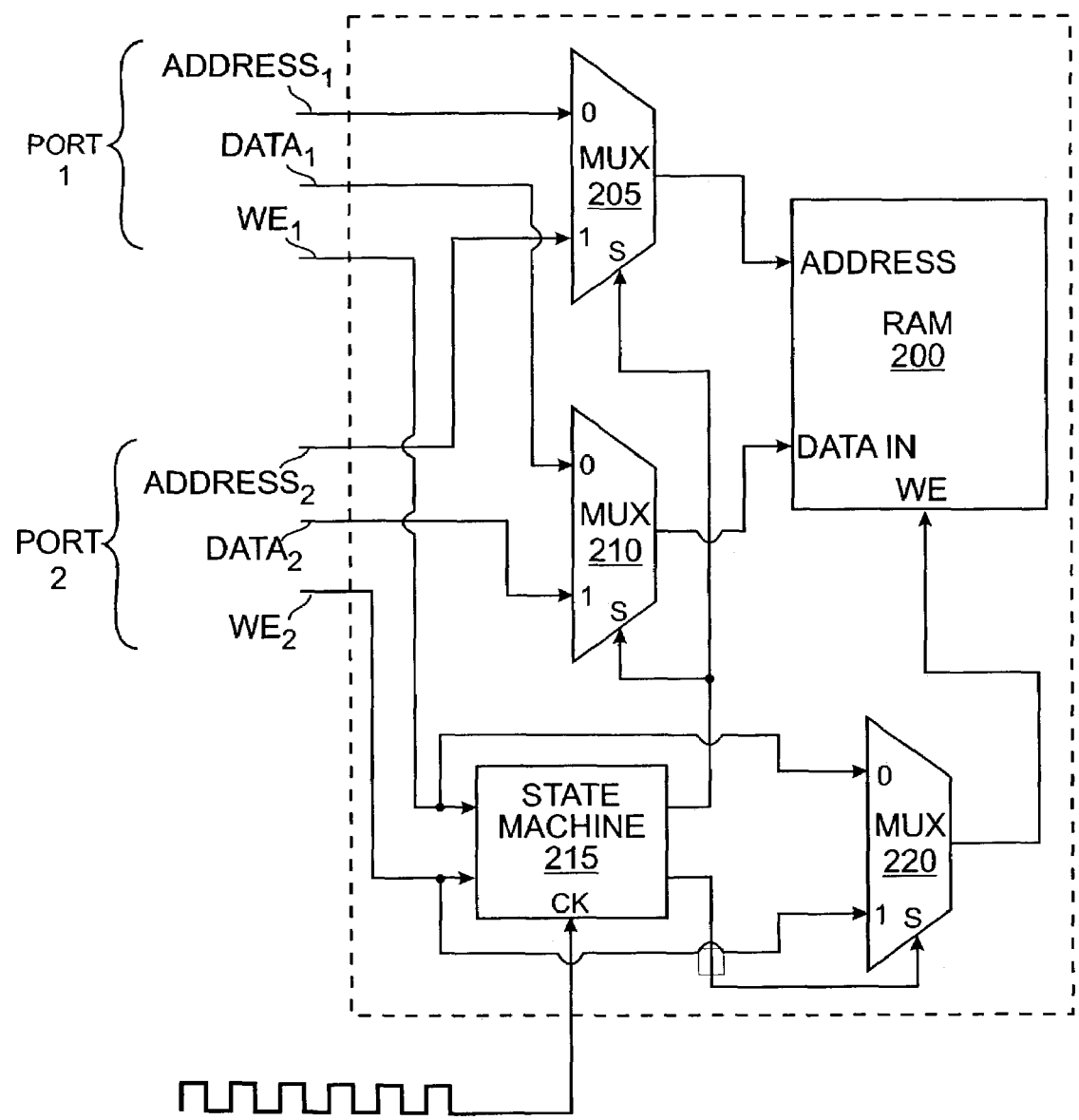
FIG. 9 is a schematic of a circuit used to implement multiport memories with single port RAMs.

The wrapper method will be explained with reference to FIG. 9. Memory cell 200 is a single port memory with an address input A, a data input D and a write enable input WE. To convert this memory cell 200 into a dual port memory, additional circuitry is added. A multiplexer 205 feeds the address input to the memory 200. A multiplexer 210 feeds the data input to the memory cell 200. Multiplexer 205 has a first input from the address input A1 of port 1 and a second input from the address input A2 of port 2. Multiplexer 210 has a first input from the data input D1 from port 1 and a second input from the data input D2 from port 2. A state machine 215 has a first input from write enable WE1 from port 1 and a second input from write enable WE2 from port 2. State machine 215 has a clock input that receives a fast clock signal, which preferably has a frequency much faster than the frequency that the emulator runs at. State machine 215 has a first output that drives the select inputs of multiplexers 205 and 210. State machine 215 has a second output that drives the select input of a multiplexer 220. Write enable WE1 from port 1 drives a first input on multiplexer 220 while write enable WE2 from port 2 drives a second input on multiplexer 220.

The various embodiments described herein have been discussed in terms of utilizing the hardware of the emulator to perform memory restore. The various embodiments disclosed herein, however, can also be performed by software on a workstation instead of inside the emulator hardware. The manner in which software is used to perform memory restoration is as follows. When the reconstructed memory will be written to a verification system other than the emulator for which the DUV was originally run on, the contents of the memory in the DUV together with the data that was recorded from the write operations during the capture stage are transferred to the workstation that controls the emulator. A software program will then reconstruct the contents of the memory using the method as described before, and transfer the contents of the reconstructed memory to the alternate verification system. Alternative logic verification system such as software simulators allow the memory operations of the DUV to be analyzed using the simulator. When the reconstructed memory will be written back into the same emulator which was originally running the DUV, the contents of the RAM do not need to be read into the workstation. The contents of the buffer (trace or linear) is transferred into the workstation, where the memory is reconstructed. After reconstruction, the workstation transfers only those addresses that have been changed back into the emulator. Note that if this method is utilized, the addresses must be tracked so that the addresses that were written are known, which prevents writing data into incorrect addresses. Regardless of whether the reconstructed memory is transferred to an emulator or another verification systems such as another emulator or a software simulator, this reconstruction process can be done either on the entire contents of the memory, or just on parts of the memory that were affected by the write operations during the capture stage (i.e., the trace window). By selectively performing reconstruction on only those parts of the memory in the DUV that were affected by the write operation during the trace window, the amount of data that needs to be transferred back and forth between the emulator and the workstation is significantly reduced. In addition, less manipulation of the netlist may be necessary because, for example, multiplexers (e.g., multiplexers 50, 52) will be not be needed at the inputs to the write ports.

Also note that the methods described herein can also be used in other systems for simulating designs such as simulation acceleration engines that use specialized hardware, or software simulators. Some modifications may be necessary, however. For example, in a software simulator, multiplexers would not be necessary for selection between original design write operations and restoration write operations (i.e., writing data from the circular or linear buffers). In addition, when restoring the contents of the memories in a software simulator, the memory restore method can be done by a separate program that is not part of the simulator.

Thus, the various embodiments disclosed herein can be used for either simulating or emulating a digital design. In addition, the various embodiments disclosed herein are useful when emulating a design using test vectors or when the emulator is operating with a target system (i.e., during in circuit emulation).

The various embodiments disclosed herein may take the form of a computer program comprising a series of instructions. These instructions may be supplied on computer usable media. Common forms of computer-usable media include, for example: a floppy disk, flexible disk, hard disk, magnetic tape, any other magnetic medium, CD-ROM, any other optical medium, punchcards, papertape, any other physical medium with patterns of holes, RAM, ROM, PROM (i.e., programmable read only memory), EPROM (i.e., erasable programmable read only memory), including FLASH-EPROM, any other memory chip or cartridge, carrier waves, or any other medium.

Thus, various embodiments of the present invention have been described with reference to specific embodiments. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense, and the invention is not to be restricted or limited except in accordance with the following claims and their legal equivalents.

We claim:

1. An apparatus for restoring memories in a circuit design that is being debugged, the circuit design comprising a random access memory (RAM), the RAM comprising a write port having a data input and an address input, the RAM further comprising a read port and a plurality of memory locations for storing data, each of the plurality of memory locations comprising an address, comprising:
   a shadow read port corresponding to the write port, said shadow read port comprising an address input that receives an address from an address input of the RAM and a data output;
   a buffer, said buffer in communication with the address input of the RAM, said buffer also in communication with said data output of said shadow read port, said buffer having an address output and a data output;
   a first multiplexer feeding the address input on the write port, said first multiplexer having a first input in communication with said address output of said buffer, said first multiplexer having a second input in communication with the address input of the RAM;
   a second multiplexer feeding the data input on the write port, said second multiplexer having a first input in communication with said data output of said buffer, said second multiplexer having a second input in communication with the data input of the RAM; and
   said first multiplexer and said second multiplexer each having a select input that switches between a first mode and a second mode,
   wherein said shadow read port, said buffer, said first multiplexer, and said second multiplexer each are implemented via a hardware logic verification system selected from a group consisting of a processor-based emulation system and a field programmable gate array-based emulation system.

2. The apparatus of claim 1 wherein said buffer is in communication with a state machine.

3. The apparatus of claim 1 wherein said first mode allows signals from the address input of the RAM to be fed to the address input on the write port by said first multiplexer and signals from the data input of the RAM to be fed to the data input on the write port by said second multiplexer.

4. The apparatus of claim 3 wherein said second mode allows signals from said address output of said buffer to be fed to the address input on the write port by said first multiplexer and signals from the data output of said buffer to be fed to the data input on the write port by said second multiplexer.

5. The apparatus of claim 4 further comprising a state machine in communication with said buffer.

6. The apparatus of claim 5 wherein said state machine controls which data and addresses stored in said buffer are read out of said address output and said data output of said buffer when said apparatus is in said second mode.

7. An apparatus for restoring memories in a circuit design that is being debugged, the circuit design comprising a random access memory (RAM), the RAM comprising a first write port and a second write port, said first write port comprising a first data input and a first address input, said second write port comprising a second data input and a second address input, the RAM further comprising first design data input, a first design address input, a second design data input and a second design address input, and a plurality of memory locations for storing data, each of the plurality of memory locations comprising an address, comprising:
   a first shadow read port that corresponds to the first write port, the first shadow read port comprising an address input that receives an address from the first design address input, said first shadow read port further comprising a data output;

a second shadow read port that corresponds to the second write port, the second shadow read port comprising an address input that receives an address from the second design address input, said second shadow read port further comprising a data output;

a first buffer, said first buffer in communication with the first design address input, said first buffer also in communication with said data output of said first shadow read port, said first buffer having an address output and a data output;

a second buffer, said second buffer in communication with the second design address input, said second buffer also in communication with said data output of said second shadow read port, said second buffer having an address output and a data output;

a first multiplexer feeding the first address input on the first write port, said first multiplexer having a first input in communication with said address output of said second buffer, said first multiplexer having a second input in communication with the first design address input;

a second multiplexer feeding the first data input on the first write port, said second multiplexer having a first input in communication with said data output of said second buffer, said second multiplexer having a second input in communication with the first design data input;

a third multiplexer feeding the second address input on the second write port, said third multiplexer having a first input in communication with said address output of said first buffer, said third multiplexer having a second input in communication with the second design address input;

a fourth multiplexer feeding the second data input on the second write port, said fourth multiplexer having a first input in communication with said data output of said first buffer, said fourth multiplexer having a second input in communication with the second design data input; and said first multiplexer, said second multiplexer, said third multiplexer and said fourth multiplexer each having a select input that switches between a first mode and a second mode, wherein said first and second shadow read ports, said first and second buffers, and said first, second, third, and fourth multiplexers each are implemented via a hardware logic verification system selected from a group consisting of a processor-based emulation system and a field programmable gate array-based emulation system.

8. A method for restoring memories in a circuit design comprising a random access memory (RAM) so that the circuit design can be debugged, the RAM comprising a write port and a plurality of memory locations for storing data, each of the plurality of memory locations comprising an address, the method comprising:

inserting a shadow read port into the circuit design corresponding to the write port, said shadow read port comprising an address input that receives an address from the circuit design, the shadow read port further comprising a data output;

scheduling said shadow read port to read data stored at a selected memory address in the RAM immediately prior to writing data into said selected memory address by the write port;

interconnecting said data output of said shadow read port to a buffer, said buffer storing data read in said scheduling step in a selected memory location, said buffer comprising a data output and an address output;

inserting a first multiplexer into the circuit design such that said first multiplexer feeds an address input on the write port, said first multiplexer having a first input in communication with an address input from the circuit design;

inserting a second multiplexer into the circuit design such that said second multiplexer feeds a data input on the write port, said second multiplexer having a first input in communication with a data input from the circuit design;

interconnecting said address output of said buffer to a second input of said first multiplexer;

interconnecting said data output of said buffer to a second input of said second multiplexer; and after a checkpoint, transferring the data stored at said selected memory location within said buffer to the selected memory address in the RAM, wherein said shadow read port, said first and second muilipiexers, and said buffer each are implemented via a hardware logic verification system selected from a group consisting of a processor-based emulation system and a field programmable gate array-based emulation system.

9. The method of claim 8 wherein said transferring step further comprises:

sending data stored at said selected memory locations within said buffer in a last in, first out order such that each of the selected one of the plurality of memory locations in the RAM is rewound to states held prior to said checkpoint.

10. The method of claim 8 further comprising observing at least some of the data stored in the selected one of the plurality of memory locations in the RAM after said transferring step.

* * * * *